United States Patent
Chandrasekaran (10) Patent No.: US 6,801,086 B1
(45) Date of Patent: Oct. 5, 2004

(54) ADAPTIVE DIGITAL PRE-DISTORTION USING AMPLIFIER MODEL THAT INCORPORATES FREQUENCY-DEPENDENT NON-LINEARITIES

(75) Inventor: Rajiv Chandrasekaran, Basking Ridge, NJ (US)

(73) Assignee: Andrew Corporation, Orland Park, IL (US)

( * ) Notice: Subject to any disclaimer, the term of this patent is extended or adjusted under 35 U.S.C. 154(b) by 79 days.

(21) Appl. No.: 10/245,008

(22) Filed: Sep. 17, 2002

Related U.S. Application Data (60) Provisional application No. 60/369,488, filed on Apr. 3, 2002.

(51) Int. Cl.[7] .............................. H03F 1/26; H03K 1/02
(52) U.S. Cl. ....................................... 330/140; 375/296
(58) Field of Search ............................. 330/2, 52, 149, 330/296, 297; 375/296, 297

(56) References Cited

U.S. PATENT DOCUMENTS

| | | | |
|---|---|---|---|
| 4,870,371 A | | 9/1989 | Gottwald et al. ............ 330/149 |
| 5,141,390 A | * | 8/1992 | Haentjens .................. 415/52.1 |
| 6,057,733 A | * | 5/2000 | Donaldson et al. ......... 330/151 |
| 6,141,390 A | | 10/2000 | Cova .......................... 375/297 |
| 6,166,603 A | | 12/2000 | Smith ......................... 330/263 |
| 6,216,100 B1 | * | 4/2001 | Meghdadi et al. ............ 703/15 |
| 6,236,267 B1 | | 5/2001 | Anzil ......................... 330/149 |
| 6,281,747 B2 | | 8/2001 | Ahuja et al. ................ 330/109 |
| 6,288,610 B1 | | 9/2001 | Miyashita ................... 330/149 |
| 6,335,767 B1 | | 1/2002 | Twitchell et al. ........... 330/149 |
| 6,366,177 B1 | | 4/2002 | McCune et al. ............. 330/103 |
| 6,417,731 B1 | | 7/2002 | Funada et al. .............. 330/149 |
| 6,587,514 B1 | * | 7/2003 | Wright et al. ............... 330/149 |
| 2001/0033238 A1 | | 10/2001 | Velazquez ................... 341/118 |
| 2002/0008578 A1 | | 1/2002 | Wright et al. ............... 330/149 |
| 2002/0041210 A1 | | 4/2002 | Booth et al. ................ 330/149 |
| 2002/0060606 A1 | | 5/2002 | Andre ......................... 330/149 |
| 2002/0080891 A1 | | 6/2002 | Ahn et al. ................... 375/297 |
| 2002/0125947 A1 | | 9/2002 | Ren ............................ 330/149 |

FOREIGN PATENT DOCUMENTS

| | | |
|---|---|---|
| EP | 1 193 866 A1 | 4/2002 |
| GB | 2 348 755 A | 10/2000 |
| WO | WO 00/25495 | 5/2000 |
| WO | WO 00/74232 A1 | 12/2000 |
| WO | WO 01/56146 A1 | 8/2001 |
| WO | WO 01/63750 A1 | 8/2001 |

OTHER PUBLICATIONS

"An Efficient Adaptive Predistorter for Nonlinear High Power Amplifier in Satellite Communication", by Hyun Woo Kang et al., Circuits and Systems 1997, Proceedings of 1997 IEEE International Symposium on Hong Kong Sep. 12, 1997, , pp. 2288–2291.

"Generation of Multicarrier Complex Lowpass Models of RJ ICs", by Peter Dobrovolny et al., 2001 IEEE MTT-s International Microwave Symposium Digest, Phoenix, AZ, May 20–25, 2001, pp. 419–422.

"Modulo Pre-Equalization of Nonlinear Communication Channels", by Andreas Kambanellas et al., Signal Processing Advances in Wireless Communications, 1999, IEEE Workshop on Annapolis, MD May 9–12, 1999, pp. 46–49.

"A simplex method for function minimization", by J.A. Nelder and R. Mead, Computer Journal, vol. 7 (1965), pp. 308–313.

* cited by examiner

*Primary Examiner*—Khanh Van Nguyen
(74) *Attorney, Agent, or Firm*—Steve Mendelsohn (57) ABSTRACT

A pre-distorter pre-distorts an input signal prior to being applied to an amplifier in order to reduce spurious emissions in the resulting amplified signal. The pre-distorter implements an inverted version of a model of the amplifier that models both the frequency independent (FI) characteristics of the amplifier as well as the frequency-independent (FD) characteristics of the amplifier. Techniques and architectures are presented for (1) generating and updating the model, (2) inverting the model, and (3) updating the inverted model.

40 Claims, 5 Drawing Sheets

ADAPTIVE DIGITAL PRE-DISTORTION USING AMPLIFIER MODEL THAT INCORPORATES FREQUENCY-DEPENDENT NON-LINEARITIES

CROSS-REFERENCE TO RELATED APPLICATIONS

This application claims the benefit of the filing date of provisional application No. 60/369,488, filed on Apr. 3, 2002.

BACKGROUND OF THE INVENTION

1. Field of the Invention

The present invention relates to signal processing, and, in particular, to the pre-distortion of signals for transmission, for example, in a wireless communication network, to reduce spurious emissions.

2. Description of the Related Art

Modern wireless communication networks employ complex modulation schemes that necessitate tight control of spurious emissions (sometimes called "out-of-band emissions") in order to avoid interfering with neighboring carriers and to comply with the requirements of regulatory bodies (e.g., FCC) and standards bodies (e.g. ITU). One source of spurious emissions is the base station transmitter amplifier that is used to amplify signals prior to transmission as wireless (e.g., RF) signals to wireless (e.g., mobile) units in a wireless communication network, such as a cellular voice and/or data network. Prior art techniques for reducing such spurious emissions were able to satisfy previous requirements. However, recent developments in wireless communication networks (e.g., Universal Mobile Telecommunication Service (UMTS)) place additional burden on the base station transmitter amplifier and make it advantageous to reduce the spurious emissions even further.

In the prior art, quasi-linear amplifiers operating in Class A, A/B, or B modes have been modeled as a memory-less non-linearity. (As is known in the art, different classes of operation relate to different quiescent operating points of the amplifiers. In Class A, the transistor is "on" for the whole cycle of a sine wave input. In Class B, the transistor is "on" for half the cycle. And, in Class A/B, the transistor is one for more than 50%, but less than 100% of the cycle.) Under the assumption of being modeled as a memory-less non-linearity, the input-output relationship is given by Equation (1) as follows:

$$y = G(a_x)x \quad (1)$$
$$= (G_i(a_x) + jG_q(a_x))x$$
$$= G_m(a_x)e^{jG_p(a_x)}x$$

where:
$x = a_x e^{j\phi_x}$ is the complex baseband representation of the input signal, where $a_x$ is the amplitude and $\phi_x$ is the phase of the input signal x,
y is the complex baseband representation of the output signal, and
$G_i(\cdot), G_q(\cdot)$ are arbitrary (i.e., unspecified but suitable) functions of the input signal envelope.

In the above model, it is assumed that the instantaneous gain of the amplifier is solely a function of the instantaneous input envelope. This model can be used to describe both AM/AM and AM/PM distortions that are observed in most amplifiers operating in Class A, A/B, and B modes, where AM means amplitude modulation and PM means phase modulation. A digital pre-distorter can be constructed to linearize an amplifier that is described by the above model.

Figure 1:
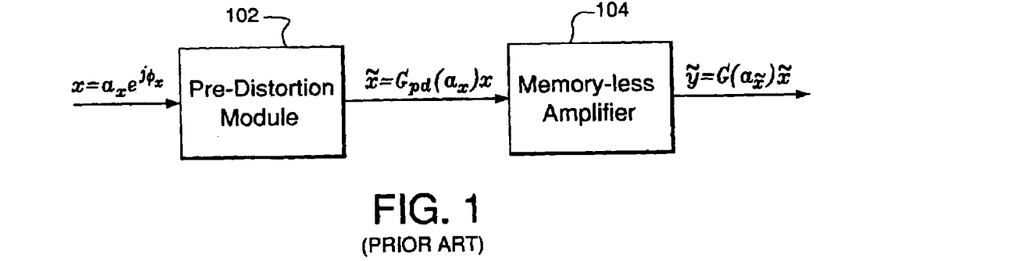
FIG. 1 shows a block diagram of a conventional amplifier pre-distortion architecture.

FIG. 1 shows a block diagram of a conventional amplifier pre-distortion architecture 100 comprising digital pre-distorter 102, which pre-distorts the input signal prior to amplification by memory-less amplifier 104. Pre-distorter 102 implements.

1. A method for computing the instantaneous input envelope $a_x$, and
2. A method of pre-distorting the input signal by multiplying the input signal by a complex gain that is solely a function of the instantaneous input envelope.

If the pre-distorted signal is given by $\tilde{x} = G_{pd}(a_x)x$ where $G_{pd}(\cdot)$ is the pre-distorter gain, then the input-output relationship for the cascaded pre-distorter and amplifier system can be written according to Equation (2) as follows:

$$\tilde{y} = G(a_{\tilde{x}})\tilde{x} \quad (2)$$
$$= G(|G_{pd}(a_x)|a_x)G_{pd}(a_x)x$$

The pre-distorter gain is computed so that the gain of the pre-distorter cascaded with the amplifier is constant. Therefore, for the ideal pre-distorter $G(|G_{pd}(a_x)|a_x)G_{pd}(a_x) = G_{tgt}$, where $G_{tgt}$ is the target gain for the amplifier.

Figure 2:
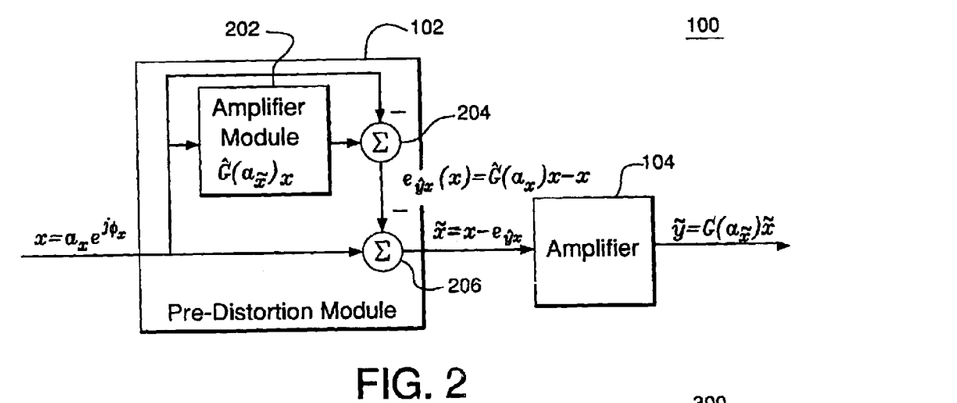
FIG. 2 is a block diagram of the amplifier pre-distortion architecture of FIG. 1, showing further detail on a conventional implementation of the pre-distorter.

FIG. 2 is a block diagram of amplifier pre-distortion architecture 100 of FIG. 1, showing further detail on a conventional implementation of pre-distorter 102 in which pre-distorter 102 pre-distorter the input signal prior to amplification by memory-less amplifier 104. In particular,pre-distorter 102 comprises a model 202 of amplifier 104. The input signal x is applied to the amplifier model 202 to generate a model $\hat{G}(a_x)x$ of the distorted output signal. Difference node 204 generates an estimate of the input-output error based on the input signal x and the modeled distorted output signal $\hat{G}(a_x)x$ according to Equation (3) as follows:

$$e_{\tilde{y}x}(x) = \hat{G}(a_x)x - x, \quad (3)$$

where $\hat{G}(\cdot)$ is an estimate of the amplifier gain. The pre-distorted signal $\tilde{x}$ is generated at difference node 206 by subtracting the estimated error $e_{\tilde{y}x}$ from the input signal x, where the pre-distorted signal $\tilde{x}$ is then applied to amplifier 104.

For the sake of clarity, assume that the input and output signals are normalized such that the target gain is unity. Further, assume that the amplifier behaves as a true memory-less linearity. It can be shown that, if amplifier model 202 is constructed accurately, the output $\tilde{y}$ of amplifier 104 with the pre-distorted signal input $\tilde{x}$ is given by Equation (4) as follows:

$$\tilde{y} = G(a_{\tilde{x}})\tilde{x} \quad (4)$$
$$\approx G(a_x)x - e_{\tilde{y}x}$$
$$= x + x(G(a_x) - \hat{G}(a_x))$$
$$\approx x$$

Memory-less amplifier model 202 is only an approximate model for most amplifier systems. Consequently, the optimal pre-distorter constructed from such a model cannot completely linearize most amplifiers.

SUMMARY OF THE INVENTION

The problems in the prior art are addressed in accordance with the principles of the present invention by an amplifier model that is able to model the performance of most Class A, A/B, and B amplifiers more accurately than the simple memory-less models of the prior art, such as model 202 of FIG. 2. In certain embodiments of the present invention, a pre-distorter pre-distorts an input signal prior to being applied to an amplifier in order to reduce spurious emissions in the resulting amplified signal. The pre-distorter implements an inverted version of a model of the amplifier that models both the frequency-independent (FI) characteristics of the amplifier as well as the frequency-dependent (FD) characteristics of the amplifier.

In one embodiment, the present invention is a method and apparatus for pre-distorting a signal for amplification. According to the embodiment, an input signal is received, and pre-distortion is applied to the input signal to generate a pre-distorted signal, such that, when the pre-distorted signal is applied to an amplifier to generate an amplified signal, the pre-distortion reduces spurious emissions in the amplified signal. The pre-distortion is generated using an inverse of a model of the amplifier, where the model comprises a model of frequency-independent characteristics of the amplifier in combination with a model of frequency-dependent characteristics of the amplifier.

In another embodiment, the present invention is an apparatus for pre-distorting a signal for amplification. Each of one or more high-order transfer function elements is configured to apply a transfer function of a different order greater than one to a corresponding distortion product for an input signal. A summation node is configured to sum the input signal and the output of each high-order transfer function element. An inverted transfer function element is configured to apply an inverted first-order transfer function to the output of the summation node. An inverted FI element is configured to invert the frequency-independent gain of the amplifier to generate a pre-distorted signal, such that, when the pre-distorted signal is applied to an amplifier to generate an amplified signal, spurious emissions in the amplified signal are reduced.

In another embodiment, the present invention is a method for generating a model of an amplifier, wherein the model comprises an FI model of frequency-independent characteristics of the amplifier in combination with an FD model of frequency-dependent characteristics of the amplifier, wherein the model is generated by estimating a plurality of transfer functions for the FD model in a sequence corresponding to increasing order of the transfer function.

In another embodiment, the present invention is a method for adaptively updating a pre-distorter configured to pre-distort an input signal for application to an amplifier configured to generate an amplified signal, the pre-distorter comprising at least one look-up table (LUT), wherein the at least one LUT is adaptively updated by minimizing an error between the input signal and a feedback signal based on the amplified signal.

BRIEF DESCRIPTION OF THE DRAWINGS

Other aspects, features, and advantages of the preset invention will become more fully apparent from the following detailed description, the appended claims, and the accompanying drawings in which like reference numerals identify similar or identical elements.

DETAILED DESCRIPTION

Figure 3:
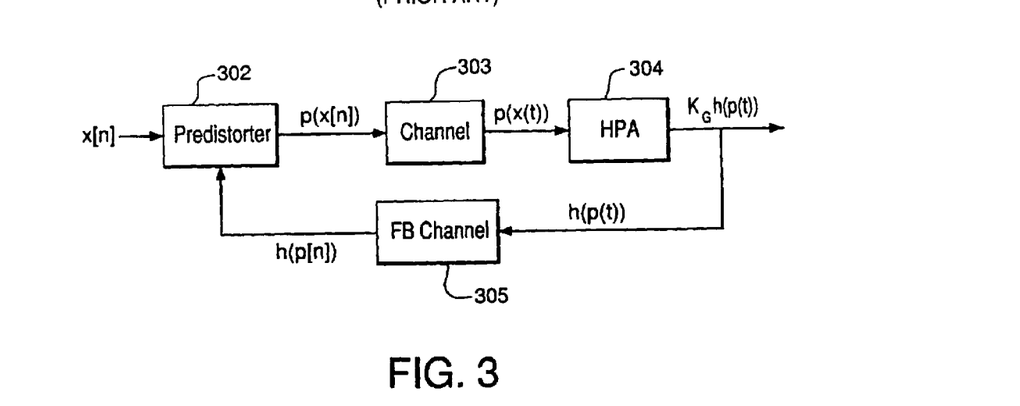
FIG. 3 shows a block diagram of an amplifier pre-distortion architecture, according to one embodiment of the present invention.

FIG. 3 shows a block diagram of an amplifier pre-distortion architecture 300, according to one embodiment of the present invention. As shown in FIG. 3, the discrete-time, input signal x[n] is applied to digital pre-distorter 302, which generates a digital, pre-distorted signal p(x[n]) based on a model of high-power amplifier (HPA) 304. The digital, pre-distorted signal then passes trough channel 303 and arrives at amplifier 304 as an analog, pre-distorted signal p(x(t)). Channel 303 includes appropriate digital-to-analog converters, IF to RF upconverters, mixers, and filters that convert the digital, pre-distorted signal p(x[n]) into the analog, pre-distorted signal p(x(t)). Amplifier 304 generates analog, output signal h(p(t)), where h(·) is the transfer function of amplifier 304 whose gain is $k_G$. Architecture 300 also includes a feedback (FB) channel 305, which samples the output signal h(p(t)) and provides a digital FB signal h(p[n]) to pre-distorter 302, which periodically updates its processing according to that feedback signal.

Figure 4:
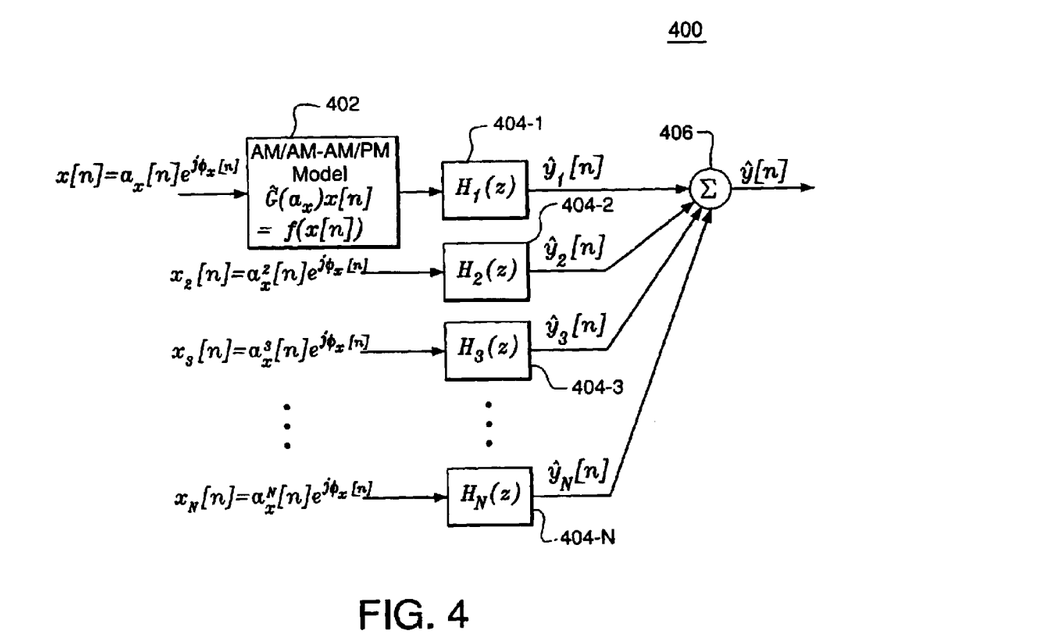
FIG. 4 shows a discrete-time representation of the model of a Class A, A/B, or B amplifier, according to one embodiment of the present invention.

FIG. 4 shows a discrete-time representation of model 400 of a Class A, A/B, or B amplifier, such as amplifier 304 of FIG. 3, according to one implementation of the present invention. As indicated in FIG. 4, the output ŷ[n] of the amplifier is modeled as a sum of several components $\hat{y}_i[n]$, where:

$\hat{y}_1[n]$ is the result of applying the input signal x[n] to model 402 and then to first-order transfer function $H_1(z)$ module 404-1, which models the output matching networks. Model 402, which models AM/AM and AM/PM distortion to the first order, applies a gain $\hat{G}(a_x)$, which is a memory-less nonlinear function of the input signal envelope $a_x$;

$\hat{y}_2[n]$ is the output of an arbitrary transfer function acting on a second-order distortion product $x_2[n]$ of the input according to Equation (5) as follows:

$$\hat{y}_2[n] = a_x^2[n] e^{j\phi^x[n]} * h_2[n] \qquad (5)$$

where "*" represents convolution and $h_2[n]$ is the impulse response corresponding to second-order transform function $H_2(z)$ module 404-2, which applies the z-transform of the transfer function;

$\hat{y}_3[n]$ is the output of an arbitrary transfer function acting on a third-order distortion product $x_3[n]$ of the input according to Equation (6) as follows:

$$\hat{y}_3[n] = a_x^3[n] e^{j\phi^x[n]} * h_3[n] \qquad (6)$$

where $h_3[n]$ is the impulse response corresponding to third-order transform function $H_3(z)$ module 404-3, which applies the z-transform of the transfer function; and so on until $\hat{y}_n[n]$ is the output of an arbitrary transfer function acting on a $N^{th}$ order distortion product $x_n[n]$ of the input according to Equation (7) as follows:

$$\hat{y}_N[n] = a_x^N[n] e^{j\phi^x[n]} * h_N[n] \qquad (7)$$

where $h_n[n]$ is the impulse response corresponding to $N^{th}$-order transform function $H_N(z)$ module 404-N, which applies the z-transform of the transfer function.

These N components $\hat{y}_i[n]$ are added together at summation node 406 to form the modeled amplifier output signal $\hat{y}[n]$, where, in general, N may be any positive integer. Model 400 becomes more accurate as more higher-order products are added to the output. Note that the transfer function $H_1(z)$, whose impulse response is denoted by $\{h_1[n]\}$, models the frequency dependence resulting from the output matching networks and combiners. For most, practical applications, the transfer functions $H_i(z)$ can be modeled as causal finite impulse response (FIR) filters.

Figure 5:
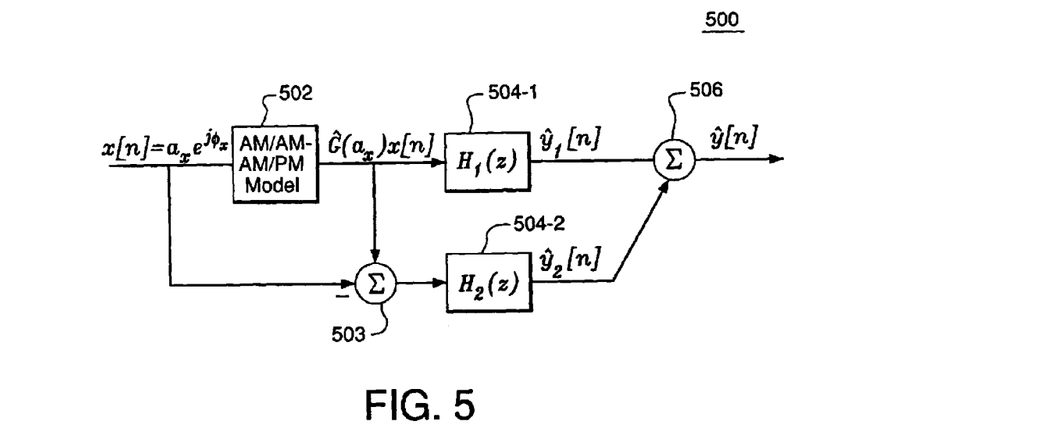
FIG. 5 shows a discrete-time representation of an amplifier model, according to an alternative implementation of the present invention.

FIG. 5 shows a discrete-time representation of an amplifier model 500, according to an alternative implementation of the present invention. In model 500, AM/AM-AM/PM model 502 and first-order transfer function module 504-1 are analogous to AM/AM-AM/PM model 402 and first-order transfer function module 400-1 of FIG. 4. In model 500, however, all the higher-order distortion products of the input signal are processed by a single, second-order transfer function $H_2(z)$ module 504-2.

Furthermore, as shown in FIG. 5. the input signal $x[n]$ is subtracted from the pre-distorted output of AM/AM-AM/PM model 502 at difference node 503. As such, the output $y_2[n]$ from second-order transfer function module 504-2 may be given according to Equation (8) as follows:

$$\hat{y}_2[n] = (G(|x[n]|) - x[n]) x[n] * h_2[n]) \qquad (8)$$

Amplifier model 500 should be adequate for most pre-distortion applications. If better performance is required from the pre-distorter, the more general amplifier model 400 of FIG. 4 can always be used.

Independent of which amplifier model of the present invention is to be used, the parameters for the selected model need to be computed. This includes computing estimates of the memory-less amplifier gain $G(\cdot)$ and all of the transfer functions $H_1(z)$. Once computed, an amplifier model in accordance with the present invention can be substituted for prior-art amplifier model 202 in the pre-distortion architecture of FIG. 2, and the resulting pre-distorter architecture (or any other suitable architecture) can be used to invert the model and linearize the amplifier.

Figure 6:
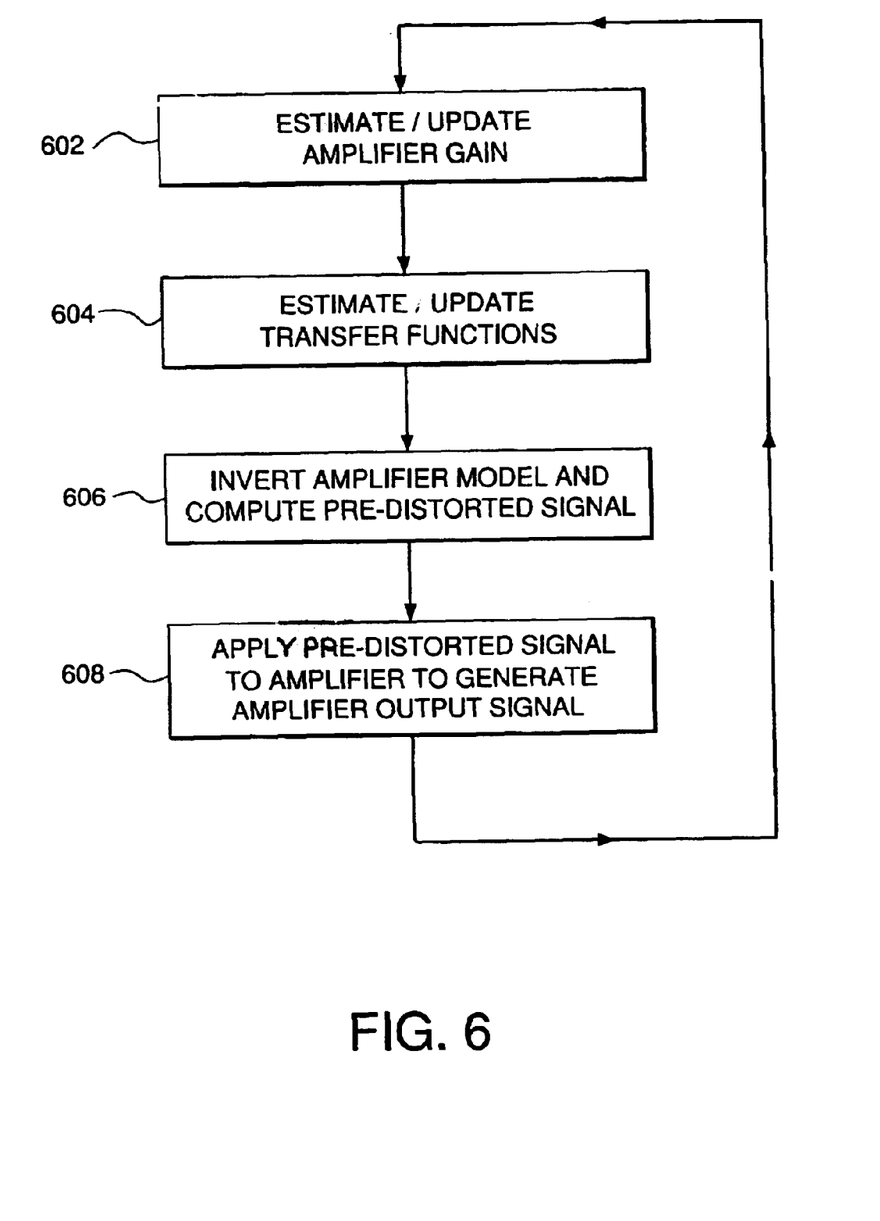
FIG. 6 shows a flow diagram of the processing implemented by the pre-distorter of FIG. 3, according to one embodiment of the present invention.

FIG. 6 shows a flow diagram of the processing involved in generating and updating an amplifier model, such as model 400 of FIG. 4 or model 500 of FIG. 5, according to one embodiment of the present invention. At step 602 of FIG. 6, the gain of the amplifier is estimated. If actual time-synchronized samples of the input ($x=[x_1 \ x_2 \ \ldots \ x_N]^t$) and output ($y=[y_1 \ y_2 \ \ldots \ y_N]_1$) signals at baseband are available, then the measured gain $G_{measured}$ can be calculated according to Equation (9) as follows:

$$G_{measured} = \left[\frac{y_1}{x_1} \ \frac{y_2}{x_2} \ \ldots \ \frac{y_N}{x_N}\right]^t \qquad (9)$$

where $[\cdot]_1$ represents the transpose of a column vector. An arbitrary linear function $\hat{G}(|x|)$ can then be fit to the measured data to model the amplifier gain. The parameters for the arbitrary function can be estimated by the method of least squares. That is, the parameters of the function that models the gain are computed by minimizing the cost function $\chi$ given by Equation (10) as follows:

$$\chi = \|G_{measured} - \hat{G}\|_W^2 \qquad (10)$$

where $\hat{G} = [\hat{G}(|x_1|) \hat{G}(|x_2|) \ \ldots \ \hat{G}(|x_N|)]_1$ and W is a weighting matrix. The choice of the weighting matrix may depend on the specific application. For example, the weighting matrix can be chosen to weight the error differently at the higher power levels than at the lower power levels. If all power levels are to be weighted equally, then the weighting matrix can be chosen as the identity matrix. Note that any arbitrary nonlinear function can be fit to the measured data. Polynomials and splines are special cases of arbitrary nonlinear functions that can be used. The choice of the appropriate nonlinear function should be apparent to those skilled in the art.

After the amplifier gain has been estimated in step 602, the transfer functions are estimated in step 604. In particular, the transfer function $H_1(z)$ may be estimated by minimizing the cost function $\chi_0$ given by Equation (11) as follows:

$$\chi_0 = E(y[n] - h_1[n] * x_1[n])^2 \qquad (11)$$

where $x_1[n] = \hat{G}(a_x[n])x[n]$ is the output of the memory-less AM/AM-AM/PM model (e.g., model 402 of FIG. 4 or model 502 of FIG. 5). The optimum solution can be obtained by employing any of the known adaptive-estimation techniques, such as recursive least-squares (RLS), least mean square (LMS), or least-squares solutions.

After estimating $H_1(z)$, the transfer function $H_2(z)$ may be estimated by minimizing the cost function $\chi_1$ given by Equation (12) as follows:

$$\chi_1 = E(y[n] - \hat{y}_1[n] - h_2[n] * x_2[n])^2 \qquad (12)$$

Once again, the optimum solution can be obtained by employing any of the known adaptive-estimation techniques. Alternatively, the solution can be obtained in the frequency domain as follows. The optimum solution for $H_2(z)$ at a given frequency can be obtained by minimizing the cost function in the frequency domain and weighting the frequency points of interest This can then be repeated for several frequency points. Once the frequency response of $H_2(z)$ has been estimated at N distinct frequency points, the time-domain impulse response $\{h_2[n]\}$ can be obtained by a least-squares fit to the desired frequency response.

Next, the transfer function $H_3(z)$ may be estimated by minimizing the cost function $\chi_2$ given by Equation (13) as follows:

$$\chi_2 = E(y[n] - \hat{y}_2[n] - h_3[n] * x_3[n])^2 \qquad (13)$$

where $\hat{y}_2[n] = \hat{y}_1[n] + h_2[n] * x_2[n]$. Any higher-order transfer functions $H_i(z)$, for $i > 3$, can be computed in analogous fashion.

Once the transfer functions have been computed, an inverted version of the amplifier model can be constructed and used to generate the pre-distorted signal (step 606) that is then applied to the amplifier (step 608). The pre-distorter architecture shown in FIG. 2 (or any other suitable architecture that inverts the amplifier model of FIG. 4 or FIG. 5) can be used to pre-distort the signal and linearize the amplifier.

Figure 7:
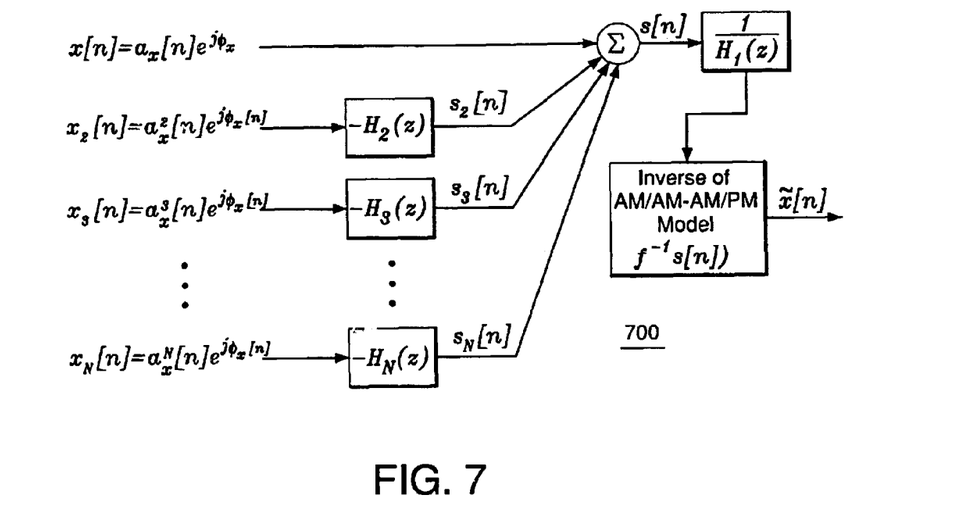
FIG. 7 shows an architecture that can be used to invert the amplifier model of FIG. 4, according to one embodiment of the present invention.

FIG. 7 shows an architecture 700 that can be used to invert amplifier model 400 of FIG. 4, according to one embodiment of the present invention. In practice, FIR filters can be used to approximate the transfer functions in architecture 700. As suggested in FIG. 7, architecture 700 may be implemented with any one or more paths of negated transfer functions of order two or greater. It is also possible to implement architecture 700 without any negated transfer function paths. In that case, the summation node may be omitted) where the input signal alone is input to the inverted first-order transfer function, followed by the inverse of the AM/AM-AM/PM model.

The estimates of the amplifier gain and transfer functions generated in steps 602 and 604 can be adaptively updated based on the amplifier output signal using suitable recursive estimation techniques. This updating is indicated in FIG. 6 by the processing returning from step 608 back to step 602 for another pass. This updating can be implemented intermittently, e.g., at fixed intervals or as necessary.

Recursive estimation techniques for adaptive filters are well known. See, e.g., Simon Haykin, *Adaptive Filter Theory*, Third Edition, Prentice Hall, 2001, the teachings of which are incorporated herein by reference. Many of these techniques can be applied to recursively estimate the transfer functions $H_1(z)$. However, recursive estimation techniques for computing the AM/AM-AM/PM pre-distorter (e.g., corresponding to model 402 of FIG. 4 or model 502 of FIG. B) are not that well known. The following discussion describes a novel method for recursively computing the memory-less pre-distorter.

Figure 8:
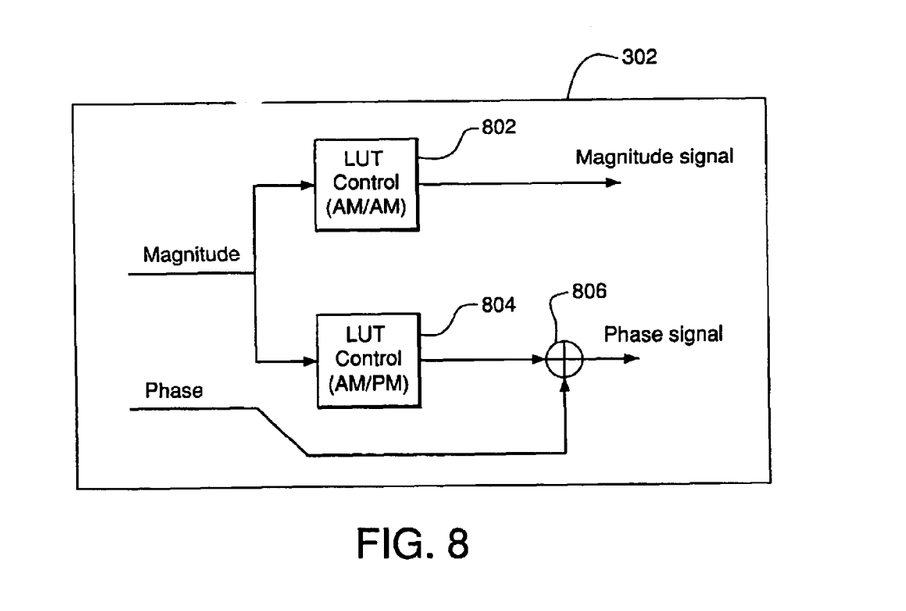
FIG. 8 shows a high-level block diagram illustrating the operation of the pre-distorter of FIG. 3.

FIG. 8 shows a high-level block diagram illustrating the operation of pre-distorter 302 of FIG. 3, according to one implementation of the present invention. In this implementation, pre-distorter 302 relies on look-up table (LUT) operation presuming the digital input signal x[n] has been converted to magnitude-phase format. The input magnitude signal is applied in parallel to both AM/AM LUT control 802 and AM/PM LUT control 804. The output from AM/AM LUT control 802 is the pre-distorted magnitude signal, while the pre-distorted phase signal is generated at summation node 806 by summing the output from AM/PM LUT control 804 with the input phase signal.

In preferred implementations, the LUTs for the AM/AM and AM/PM portions of the pre-distorter operation are adaptively revised on a periodic basis. This revision may be based on minimizing the mean-square error between the feedback signal h(p[n]) in FIG. 3 and the input signal x[n]. The cost function $\chi_k^2$ used in the feedback control is based on a current observation data set (where the input and feedback signals are assumed to have been time-aligned by performing time-delay equalization) and is defined according to Equation (14) as follows:

$$\chi_k^2 = \epsilon_k^t \epsilon_k \quad (14)$$

where $\epsilon_k = (\epsilon(1)\epsilon(2) \ldots \epsilon(k))^t$, and $\epsilon(n)$ is the normalized error between the $n^{th}$ input sample $x_n$ and the corresponding feedback amplifier sample $(h \circ p)(x_n)$ where $(h \circ p)(x_n)$ represents $h[p[x_n]]$. The normalized error is given by Equation (15) as follows:

$$\varepsilon(n) = \frac{(x_n - (h \cdot p)(x_n))}{\sigma_K} \quad (15)$$

where h(x) is the amplifier transfer function, p(x) is the pre-distortion polynomial used to generate the AM/AM and AM/PM LUTs, and $\sigma_k^2$ is the sample variance over the observation set $\{x_k: k=1, \ldots, k\}$. The pre-distortion polynomial p(x) is given by Equation (16) as follows:

$$p(x) = \sum_{m=0}^{N} a_m x^m = X^t a \quad (16)$$

where $a = (a_0, a_1, \ldots a_N)^t$ is the vector of coefficients for characterizing the LUT generator polynomial and $x^t = (1, x^1, \ldots, x^N)$ is the basis vector for linear space represented by the input data. The sample variance $\sigma_k^2$ is given by Equation (17) as follows:

$$\sigma_K^2 = \frac{1}{K-1} \sum_{k=1}^{K} (x_k - m_K)^2 \quad (17)$$

where $m_k$ is the sample mean over the observation set and is given by Equation (18) as follows:

$$m_K = \frac{1}{K} \sum_{k=1}^{K} x_k \quad (18)$$

The optimization criteria $a_k$ for the adaptation are given by Equation (19) as follows:

$$a_k = \underset{a}{\operatorname{argmin}} \{\chi_k^2\} \quad (19)$$

where $$\underset{x}{\operatorname{argmin}} \{f(x)\}$$

returns the value of x that minimizes the function $f(x)$. The optimization criteria $a_k$ are unique and are obtained by equating the gradient of the cost function $x_k^2$ with respect to the coefficient vector a to zero as in Equation (20) as follows:

$$\frac{\partial \chi_K^2}{\partial a^t} = H^t \varepsilon_K = 0 \quad (20)$$

Where the matrix H is defined by Equation (21) as follows:

$$H^t = \frac{1}{\sigma_K} \begin{bmatrix} h_0^1 & \cdots & h_0^K \\ x_1 h_1^1 & \cdots & x_K h_1^K \\ \vdots & \ddots & \vdots \\ x_1^N h_N^1 & \cdots & x_K^N h_N^K \end{bmatrix} \quad (21)$$

where $h_m^k = \partial_m (h \circ p)(x_k)$ and is defined by Equation (22) as follows:

$$\partial_m(h \cdot p)(x) = \frac{x^m}{p(x)} \left[ h \cdot p(x) + \frac{p^2(x)}{[(p \cdot p)(x)]^2} ((p \cdot p)(x) - p(x)(p' \cdot p(x))] \right] \quad (22)$$

where $$\partial_z = \frac{\partial}{\partial z}$$

is short-hand notation for a derivative or gradient, depending on the context, and p' (x) is the first derivative of the polynomial p(x) with respect to x.

Stochastic approximation can be applied to this problem to successively minimize the gradient of Equation (20). This results in the following update procedure for the coefficient set given by Equation (23) as follows:

$$a_{new} = a_{old} + \lambda(a_k - a_{old}) \quad (23)$$

where $\lambda$ is a small scalar adaptation gain (e.g., typically about 0.0005) and $$a_k = (H^tH)^{-1} H^t\epsilon_k \text{ or } a_k = D^t\epsilon_k$$

where D is the pseudo-inverse of the matrix H.

The expression in Equation (22) depends only on the following three things:
(1) The amplifier output feedback observation $(h \circ p)(x_k) = h(P(x_k))$ corresponding to the input signal $x_k = \{x_k : k=1, \ldots, k\}$;
(2) $P(x_k)$ and $P \circ P(x_k)$ are obtained from a lookup table and a recursive application of that table to itself, respectively; and
(3) $p' \circ P((x_k)$ which is (or could be) one or more separate LUTs based on the first derivative of the polynomial p(x) evaluated on the pre-distorter LUT output. If the polynomial p(x) is constrained to pass through the origin $a_0=0$, then the top row in the matrix H can be deleted. The rest of this derivation relies on that assumption.

Although the SVD is the preferred method of solution from the standpoint of numerical stability, it has the following three main drawbacks:
(1) The computation cost is significant, being proportional to $k^2$;
(2) Storage requirements are larger than other methods; and
(3) In general, double-precision computation should be used for many of the intermediate steps. As an alternative, the pseudo-inverse of H may be calculated directly using $O(N^2+KN)$ FLOPS, provided the matrix is not allowed to become ill-conditioned. One approach, which is effective against this condition, is based on the following processing:

Define a scalar γ by the algorithm:

if($\chi_k^2 > \chi_{last}^2$)
 then γ=5γ
 else γ=0.8γ
endif

The value for $\chi_{last}^2$ is the previous iteration's mean square error $\chi_k^2$.
The product matrix $H_tH$ is then (re-)defined as $$H^tH \leftarrow H^tH + \lambda \text{diag}(H^tH)$$

Using this revised definition the pseudo-inverse is calculated by inverting the NxN matrix $H_tH$. By applying this procedure, a stable and more efficient method may be implemented that should provide a 'faster' stable solution to the update procedure.

The final step in the update procedure is to recalculate and replace the AM/AM and AM/PM LUTs (and the "derivative" table) using the revised set of polynomial coefficients $a_{new}$, and to replace the previous coefficient set with this newer estimate, $a_{old} = a_{new}$. The derivative LUT generator polynomial is given by Equation (24) as follows:

$$p'(x) = \sum_{m=1}^{N} m a_m x^{m-1} \quad (24)$$

where the coefficients are the same as those for the pre-distortion LUTs.

In other implementations, it is possible that the pre-distorter is implemented with only one LUT (e.g., either only the AM/AM LUT or only the AM/PM LUT). In such implementations, the above-described update method would be applied to only the one LUTT.

Figure 9:
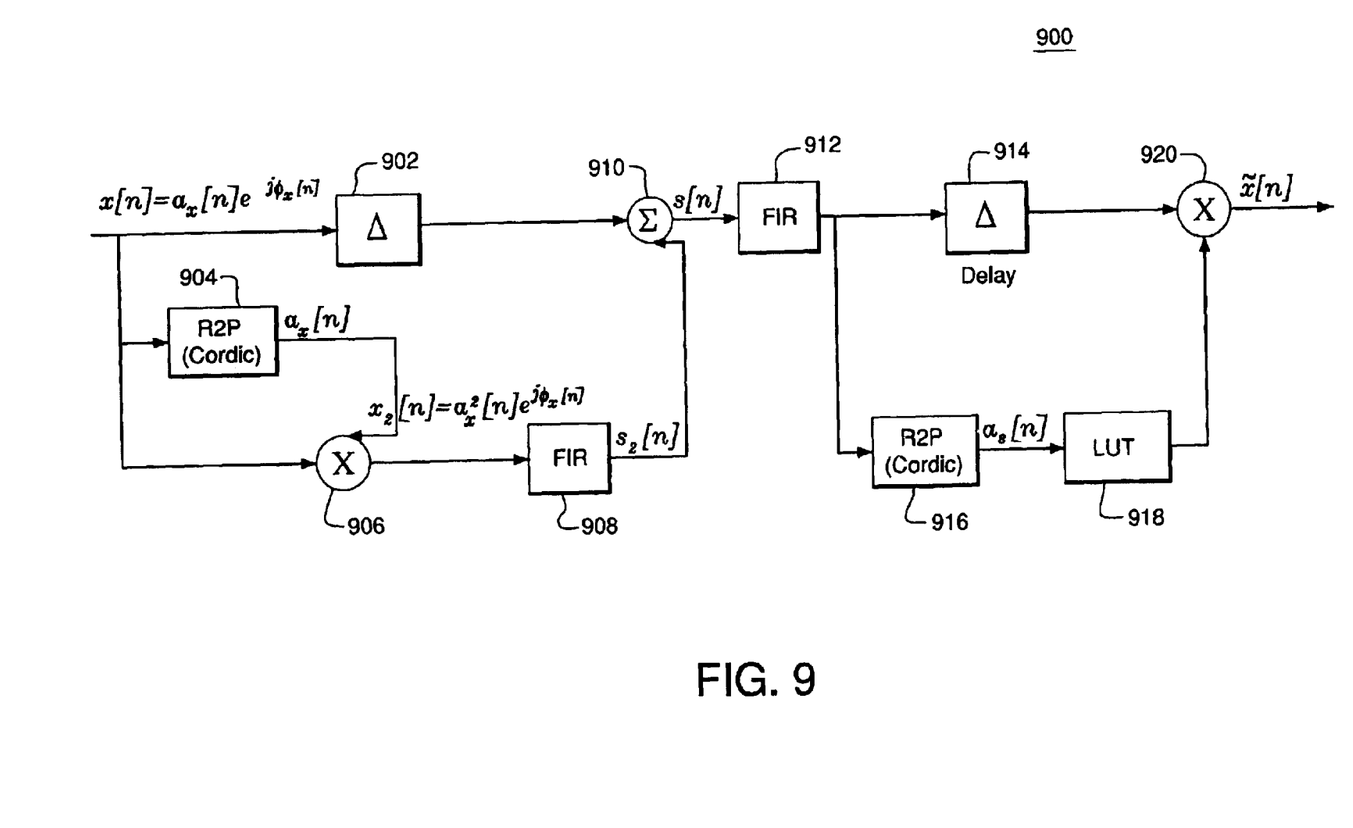
FIG. 9 shows a block diagram of an architecture for the pre-distorter of FIG. 3, according to one embodiment of the present invention.

FIG. 9 shows a block diagram of architecture 900 for pre-distorter 302 of FIG. 3, according to one embodiment of the present invention. In particular, architecture 900 corresponds to a second-order implementation of the pre-distorter architecture shown in FIG. 7, where FIR 908 implements the transfer function—$H_2(z)$, FIR 912 implements the transfer function $$\frac{1}{H_1(z)},$$

and multiplier 920 implement the inverse of the AM/AM-AM/PM model. Delays 902 and 914 are provided to maintain synchronization within architecture 900 by accounting for the processing times of their associated parallel processing paths. In general, higher-order terms ($3^{rd}$ and higher) can also be included, if desired, using the structure shown in FIG. 7.

In general, all signals in FIG. 9 are complex (shown as dark lines) except the outputs of rectangular-to-polar (R2P) converters 904 and 916. Each R2P converter computes the amplitude of its input signal using the well-known CORDIC algorithm. See, e.g., Ancaka, R., "A survey of CORDIC algorithms for FPGA based computers", Andraka Consulting Group, Inc., and Volder, J., "The CORDIC trigonometric computing technique," IRE Trans. Electronic Computing, Vol. EC-8, pp. 330–334, September 1959, the teachings of both of which are incorporated herein by reference. This implementation includes the LUT-based correction for the AM/AM-AM/PM effects, the equalizer for the channel distortion, and the correction for the seconder, frequency-dependent nonlinearity. In alternative embodiments, CORDIC R2P converters 904 and 916 could be replaced by other components that generate a suitable measure of the input signal, where, depending on the implementation, that measure could be the amplitude, power, or even a higher-order measure of the input signal.

FIG. 9 corresponds to a second-order, baseband implementation of the pre-distorter architecture of FIG. 7. Non-baseband (e.g., RF) implementations are also possible. In one possible second-order, RF implementation, FIR 912 is replaced by a baseband-to-RF converter followed by an RF filter, and multiplier 920 is replaced by a vector modulator.

The present invention may be implemented in the context of wireless signals transmitted from a base station to one or more mobile units of a wireless communication network In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be farther understood that various changes in the details, materials, and arrangements of the parts which have been described and illustrated in order to explain the nature of this invention may be made by those skilled in the art without departing from the scope of the invention as expressed in the following claims.

What is claimed is:

1. A method for pre-distorting a signal for amplification, the method comprising the steps of:
   (a) receiving an input signal; and
   (b) applying pre-distortion to the input signal to generate a pre-distorted signal, such that, when the pre-distorted signal is applied to an amplifier to generate an amplified signal, the pre-distortion reduces spurious emissions in the amplified signal, wherein:
   the pre-distortion is generated using an inverse of a model of the amplifier; and
   the model comprises a model of frequency-independent (FI) characteristics of the amplifier (an FI model) in combination with a model of frequency-dependent (FD) characteristics of the amplifier (an FD model).

2. The invention of claim 1, further comprising the step of generating at least one of the FI model and the FD model.

3. The invention of claim 2, wherein the FD model is generated by estimating a plurality of transfer functions in a sequence corresponding to increasing order of the transfer function.

4. The invention of claim 2, wherein the model is generated by:
   (1) estimating the FI model based on an estimate of the frequency-independent gain of the amplifier;
   (2) estimating a first-order transfer function for the FD model using the estimated FI model; and
   (3) estimating a second-order transfer function for the FD model using the estimated FI model and the estimated first-order transfer function.

5. The invention of claim 4, wherein:
   the FI model is estimated by minimizing a cost function that is dependent on the gain of the amplifier;
   the first-order transfer function is estimated by minimizing a cost function that is dependent on the estimated FI model; and
   the second-order transfer function is estimated by minimizing a cost function that is dependent on the estimated FI model and the estimated first-order transfer function.

6. The invention of claim 4, wherein the model is further generated by estimating one or more transfer functions for the FD model of order greater than two, wherein a transfer function of order n is estimated using the estimated FI model and each estimated transfer function of order less than n.

7. The invention of claim 2, further comprising the step of adaptively updating the model.

8. The invention of claim 7, wherein the model is adaptively updated by adaptively updating a plurality of transfer functions in a sequence corresponding to increasing order of the transfer function.

9. The invention of claim 1, wherein the FD model comprises a plurality of different-order transfer functions, each of which is configured to operate on a different-order distortion product based on the input signal, wherein:
   the output from the FI model is applied to a first-order transfer function; and
   the outputs from the plurality of transfer functions are summed to generate an estimate of the amplified signal.

10. The invention of claim 9, wherein the FD model comprises a second-order transfer function that is configured to operate on a difference between the input signal and the output from the FI model.

11. The invention of claim 9, wherein the FD model comprises one or more transfer functions having order two or greater, each of which is configured to operate on a distortion product having a corresponding order of two or greater.

12. The invention of claim 11, wherein the FD model comprises two or more transfer functions having order two or greater, each of which is configured to operate on a distortion product having a corresponding order of two or greater.

13. The invention of claim 9, wherein, in generating the model, the plurality of transfer functions are estimated in a sequence corresponding to increasing order.

14. The invention of claim 1, wherein the inverse of the model comprises:
   (1) zero, one, or more negated high-order transfer function elements, each corresponding to a negation of one of one or more transfer functions of the FD model of order greater than one and configured to operate on a corresponding distortion product;
   (2) an inverted first-order transfer function element corresponding to an inverse of a first-order transfer function of the FD model and configured to operate on the sum of the input signal and the zero, one, or more outputs from the zero, one, or more negated high-order transfer function elements; and
   (3) an inverted FI model element corresponding to an inverse of the FI model and configured to operate on the output from the inverted first-order transfer function to generate the pre-distorted signal.

15. The invention of claim 14, wherein:

the zero, one or more negated high-order transfer function elements include a negated second-order transfer function element comprising:
  (A) a first component configured to generate a measure of the input signal;
  (B) a first multiplier configured to multiply the input signal by the measure of the input signal to generate a second-order distortion product; and
  (C) a first filter configured to apply a negated second-order transfer function to the second-order distortion product;

the inverted first-order transfer function element comprises a second filter configured to apply the inverted first-order transfer function to the sum of the input signal and the one or more outputs from the one or more negated high-order transfer function elements; and the inverted FI model element comprises:
  (A) a second component configured to generate a measure of the output from the second filter;
  (B) a look-up table configured to retrieve one or more pre-distortion components based on the measure of the output from the second filter; and
  (C) a second multiplier configured to multiply the output from the second filter by the one or more pre-distortion components to generate the pre-distorted signal.

16. The invention of claim 15, wherein:

the first component is configured to generate a measure of the amplitude or the power of the input signal; and the first filter is a finite impulse response (FIR) filter.

17. The invention of claim 16, wherein the second filter is an FIR filter corresponding to the inverse of a first-order transfer function.

18. The invention of claim 16, wherein:

the inverted first-order transfer function further comprises a baseband-to-RF converter preceding the second filter;

the second filter is an RF filter corresponding to the inverse of a first-order transfer function; and the second multiplier is a vector modulator.

19. The invention of claim 1, wherein:

the inverse of the model comprises an inverse of the FI model;

the inverse of the FI model generates an inverted FI model output having an amplitude and a phase;

the magnitude of the inverted FI model output is a function of the magnitude of the input signal; and the phase of the inverted FI model output is a function of both the magnitude and phase of the input signal.

20. The invention of claim 19, wherein:

the magnitude of the inverted FI model output is derived using the input signal magnitude as an index into an AM/AM look-up table;

the phase of the inverted FI model output is derived by summing the input signal phase and a value retrieved using the input signal magnitude as an index into an AM/PM look-up table.

21. The invention of claim 20, wherein at least one of the look-up tables is adaptively updated by minimizing an error between the input signal and a feedback signal based on the amplified signal.

22. The invention of claim 21, wherein the at least one look-up table is updated by applying a recursive estimation technique to the look-up table.

23. The invention of claim 22, wherein the recursive estimation technique is based on non-linear least mean squares estimation.

24. The invention of claim 1, wherein the amplifier model is a linear combination of the FI model and the FD model, where the FI model is distinct from the FD model.

25. An apparatus for pre-distorting a signal for amplification, wherein the apparatus is configured to:
  (a) receive an input signal; and
  (b) apply pre-distortion to the input signal to generate a pre-distorted signal, such that, when the pre-distorted signal is applied to an amplifier to generate an amplified signal, the pre-distortion reduces spurious emissions in the amplified signal, wherein:

the pre-distortion is generated using an inverse of a model of the amplifier, and the model comprises an FI model of frequency-independent characteristics of the amplifier in combination with an FD model of frequency-dependent characteristics of the amplifier.

26. An apparatus for pre-distorting a signal for amplification, the apparatus comprising:
  (a) One or more high-order transfer function elements, each configured to apply a transfer function of a different order greater than one to a corresponding distortion product for an input signal;
  (b) a summation node configured to sum the input signal and the output of each high-order transfer function element;
  (c) an inverted transfer function element configured to apply an inverted first-order transfer function to the output of the summation node; and
  (d) an inverted FI element configured to apply an inverse of a model of a frequency-independent (FI) gain of the amplifier to the output of the inverted transfer function element to generate a pre-distorted signal, such that, when the pre-distorted signal is applied to an amplifier to generate an amplified signal, spurious emissions in the amplified signal are reduced.

27. The invention of claim 26, wherein:

the one or more high-order transfer function elements include a second-order transfer function element comprising:
  (A) a first component configured to generate a measure of the input signal;
  (B) a first multiplier configured to multiply the input signal by the measure of the input signal to generate a second-order distortion product; and
  (C) a first filter configured to apply a second-order transfer function to the second-order distortion product;

the inverted first-order transfer function element comprises a second filter configured to apply the inverted first-order transfer function to the sum of the input signal and the outputs from the one or more high-order transfer function elements; and the inverted FI element comprises:
  (A) a second component configured to generate a measure of the output from the second filter;
  (B) a look-up table configured to retrieve one or more pre-distortion components based on the measure of the output from the second filter; and
  (C) a second multiplier configured to multiply the output from the second filter by the one or more pre-distortion components to generate the pre-distorted signal.

28. The invention of claim 27, wherein:

the first component is configured to generate a measure of the amplitude or the power of the input signal; and the first filter is a finite impulse response (FIR) filter.

29. The invention of claim 28, wherein the second filter is an FIR filter corresponding to the inverse of a first-order transfer function.

30. The invention of claim 28, wherein:

the inverted first-order transfer function further comprises a baseband-to-RF converter preceding the second filter;

the second filter is an RF filter corresponding to the inverse of a first-order transfer function; and the second multiplier is a vector modulator.

31. The invention of claim 25, wherein the amplifier model is a linear combination of the FI model and the FD model, where the FI model is distinct from the FD model.

32. A method for generating a model of an amplifier, wherein the model comprises an FI model of frequency-independent characteristics of the amplifier in combination with an FD model of frequency-dependent characteristics of the amplifier, wherein the model is generated by estimating a plurality of transfer functions for the FD model in a sequence corresponding to increasing order of the transfer function.

33. The invention of claim 32, wherein the model is generated by:

(1) estimating the FI model based on an estimate of the frequency-independent gain of the amplifier;

(2) estimating a first-order transfer function for the FD model using the estimated FI model; and (3) estimating a second-order transfer function for the FD model using the estimated FI model and the estimated first-order transfer function.

34. The invention of claim 33, wherein:

the FI model is estimated by minimizing a cost function that is dependent on the gain of the amplifier;

the first-order transfer function is estimated by minimizing a cost function that is dependent on the estimated FI model; and the second-order transfer function is estimated by minimizing a cost function that is dependent on the estimated FI model and the estimated first-order transfer function.

35. The invention of claim 33, wherein the model is further generated by estimating one or more transfer functions for the FD model of order greater than two, wherein a transfer function of order n is estimated using the estimated FI model and each estimated transfer function of order less than n.

36. The invention of claim 32, further comprising the step of adaptively updating the model.

37. The invention of claim 36, wherein the model is adaptively updated by adaptively updating a plurality of transfer functions in a sequence corresponding to increasing order of the transfer function.

38. The invention of claim 32, wherein the amplifier model is a linear combination of the FI model and the FD model, where the FI model is distinct from the FD model.

39. A method for adaptively updating a pre-distorter configured to pre-distort an input signal for application to an amplifier configured to generate an amplified signal, the pre-distorter comprising at least one look-up table (LUT), wherein the at least one LUT is adaptively updated by minimizing an error between the input signal and a feedback signal based on the amplified signal, wherein the at least one look-un table is undated by applying a recursive estimation technique to the at least one look-up table.

40. The invention of claim 39, wherein the recursive estimation technique is based on nonlinear least mean squares estimation.

* * * * *